United States Patent
Abbott et al.

(10) Patent No.: US 6,838,757 B2
(45) Date of Patent: Jan. 4, 2005

(54) PREPLATING OF SEMICONDUCTOR SMALL OUTLINE NO-LEAD LEADFRAMES

(75) Inventors: Donald C. Abbott, Norton, MA (US); Michael E. Mitchell, Plaistow, NH (US); Paul R. Moehle, Seekonk, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/900,080

(22) Filed: Jul. 6, 2001

(65) Prior Publication Data

US 2002/0003292 A1 Jan. 10, 2002

Related U.S. Application Data

(60) Provisional application No. 60/216,548, filed on Jul. 7, 2000.

(51) Int. Cl.[7] .................................................. H01L 23/495
(52) U.S. Cl. ............................. 257/677; 257/666
(58) Field of Search .................................. 257/677, 666

(56) References Cited

U.S. PATENT DOCUMENTS

| 5,172,214 A | * | 12/1992 | Casto | 257/676 |
|---|---|---|---|---|
| 5,360,991 A | * | 11/1994 | Abys et al. | 257/666 |
| 5,635,755 A | * | 6/1997 | Kinghorn | 257/666 |
| 5,767,574 A | * | 6/1998 | Kim et al. | 257/677 |
| 5,885,891 A | * | 3/1999 | Miyata et al. | 438/612 |
| 5,914,532 A | * | 6/1999 | Akagi et al. | 257/677 |
| 5,977,620 A | * | 11/1999 | Kim et al. | 257/677 |

FOREIGN PATENT DOCUMENTS

EP     0 250 146 A1 *  12/1987

* cited by examiner

Primary Examiner—Phat X. Cao
(74) Attorney, Agent, or Firm—W. James Brady, III; Frederick J. Telecky, Jr.

(57) ABSTRACT

For a leadframe for use with integrated circuit chips, a continuous strip of sheet-like base metal is pre-plated with a layer of nickel fully covering the base metal, further on one surface with a palladium layer in a thickness suitable for bonding wire attachment, and on the opposite surface with a layer of either palladium or lead-free solder in a thickness suitable for parts attachment. The leadframe structure is then stamped from the sheet so that the base metal is exposed at the stamped edges, enhancing adhesion to molding compounds.

8 Claims, 3 Drawing Sheets

PREPLATING OF SEMICONDUCTOR SMALL OUTLINE NO-LEAD LEADFRAMES

This application claims the benefit of Provisional application Ser. No. 60/216,548, filed Jul. 7, 2000.

FIELD OF THE INVENTION

The present invention is related in general to the field of semiconductor devices and processes and more specifically to the materials and preplating method of no-lead leadframes for integrated circuit devices.

DESCRIPTION OF THE RELATED ART

The leadframe for semiconductor devices was invented (U.S. Pat. Nos. 3,716,764 and 4,034,027) to serve several needs of semiconductor devices and their operation simultaneously: First of all, the leadframe provides a stable support pad for firmly positioning the semiconductor chip, usually an integrated circuit (IC) chip. Since the leadframe including the pads is made of electrically conductive material, the pad may be biased, when needed, to any electrical potential required by the network involving the semiconductor device, especially the ground potential.

Secondly, the leadframe offers a plurality of conductive segments to bring various electrical conductors into close proximity of the chip. The remaining gap between the ("inner") tip of the segments and the conductor pads on the IC surface are typically bridged by thin metallic wires, individually bonded to the IC contact pads and the leadframe segments. Obviously, the technique of wire bonding implies that reliable welds can be formed at the (inner) segment tips.

Thirdly, the ends of the lead segment remote from the IC chip ("outer" tips) need to be electrically and mechanically connected to "other parts" or the "outside world", for instance to assembly printed circuit boards. In the overwhelming majority of electronic applications, this attachment is performed by soldering. Obviously, the technique of soldering implies that reliable wetting and solder contact can be performed at the (outer) segment tips.

It has been common practice to manufacture single piece leadframes from thin (about 120 to 250 $\mu$m) sheets of metal. For reasons of easy manufacturing, the commonly selected starting metals are copper, copper alloys, iron-nickel alloys (for instance the so-called "Alloy 42"), and invar. The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

In the European patent # 0 335 608 B1, issued Jun. 14, 1995 (Abbott, "Leadframe with Reduced Corrosion"), a palladium-plated leadframe is introduced which is not subject to corrosion due to galvanic potential forces aiding the migration of the base metal ions to the top surface where they will form corrosion products. The patent describes a sequence of layers consisting of nickel (over the base metal), palladium/nickel alloy, nickel, and palladium (outermost). This technology has been widely accepted by the semiconductor industry.

After assembly on the leadframe, most ICs are encapsulated, commonly by plastic material in a molding process. It is essential that the molding compound, usually an epoxy-based thermoset compound, has good adhesion to the leadframe and the device parts it encapsulates. The harsh temperature variations involved in post-mold outer-lead plating of solder may seriously jeopardize good adhesion.

If solder dipping is used after molding, the palladium will dissolve into the solder and the nickel is then solderable. However, solder dipping is not practical for devices with fine-pitch leadframes because of solder bridging. The typical solution to this dilemma is to use a silver spot-plated leadframe with post mold solder plating. In this process, solder is plated on the external leads which are either copper or nickel-plated copper. With small package geometries, there are tolerance limits with silver spot plating with negative effects on yield and cost.

There is increased interest in the semiconductor industry in small outline no-lead or leadless package types because of their near chip-size dimensions and lower material content and cost. These packages do not have leads, per se, but only land areas that are exposed on the bottom side of the package. The solder joint is made to these land areas. One issue with this type of package is mold compound adhesion and moisture performance. These packages are usually silver plated to allow wire bonding and then solder plated after molding to provide solderability. The solder plating operations add costs and can degrade mold compound adhesion.

The price of palladium climbed in the last decade from about one third of the gold price to approximately twice the gold price. Cost reduction pressures in semiconductor manufacturing have initiated efforts to reduce the thickness of the palladium layers employed to about one third of its previous thickness. At this thinness, palladium does not prevent oxidation of the underlying nickel which will inhibit its solderability.

In U.S. patent application No. 60/138,070, filed on 8 Jun. 1999 (Abbott, "Palladium-Spot Leadframes for Solder Plated Semiconductor Devices and Method of Fabrication"), a fabrication process for palladium layers of reduced thickness is described (combined with a process for post-mold plating solder layers). However, the masking steps required in the manufacturing process are still expensive, and any post-mold plating should better be avoided because of its potential negative impact on adhesion.

An urgent need has therefore arisen for a low-cost, reliable mass production method for a leadframe combining the advantages of palladium with its bondability and the application of a pre-plated layer enabling solderablity. The palladium layer should have reduced thickness. The leadframe and its method of fabrication should be flexible enough to be applied for different semiconductor product families and a wide spectrum of design and assembly variations, and should achieve improvements toward the goals of improved process yields and device reliability. Preferably, these innovations should be accomplished using the installed equipment base so that no investment in new manufacturing machines is needed.

SUMMARY OF THE INVENTION

According to the present invention for a semiconductor integrated circuit (IC) leadframe, a continuous strip of sheet-like base metal is pre-plated with a layer of nickel fully covering the base metal, further on one surface with a palladium layer in a thickness suitable for bonding wire attachment, and on the opposite surface with a layer of either palladium or lead-free solder in a thickness suitable for parts attachment. The leadframe structure is then stamped from the sheet so that the base metal is exposed at the stamped edges, enhancing adhesion to molding compounds.

The present invention is related to high density ICs, especially those having high numbers of inputs/outputs, or contact pads, and also to devices in small outline no-lead or leadless packages, which have near chip-size dimensions. These small outline no-lead devices can be increasingly found in many IC families such as standard linear and logic products, digital signal processors, microprocessors, digital and analog devices. The invention represents a significant cost reduction and enhances environmental protection and assembly flexibility of semiconductor packages, especially the plastic molded packages, compared to the conventional copper-based solder-plated leadframes.

It an aspect of the present invention to concurrently minimize the palladium content, improve molding compound adhesion, eliminate the need for post-mold plating, and provide a lead-free solderable outer surface.

It is a specific aspect of the present invention to provide a technology for enabling solderable package leads with pre-plated metal layers, while maintaining a thin palladium layer in the areas intended for wire bonding (with its significant cost advantage over the traditional silver spot plated inner leads).

Another aspect of the invention is to provide the lead-free solder such that it dissolves in tin-rich solder paste or solder wave when its reflow temperature is higher than semiconductor assembly temperatures, and that it does not form tin whiskers on the outside of the package.

Another aspect of the invention is to reach these goals with a low-cost manufacturing method without the cost of equipment changes and new capital investment, by using the installed fabrication equipment base. Specifically, low-cost stamping techniques are applied to fabricate the leadframe structures.

Another aspect of the invention is to produce leadframes so that established wire bonding processes can continue unchanged, and that established board attachment process can continue unchanged.

These aspects have been achieved by the teachings of the invention concerning deposition and masking methods suitable for mass production. Various modifications of leadframe preparations have been successfully employed.

In the first embodiment of the invention, a continuous strip of sheet-like metal such as copper is used, and nickel layers are flood-plated on both surfaces of the sheet. Next, a thin layer of palladium is plated on one surface in a thickness suitable for bonding wire attachment. A thicker layer of palladium is then plated on the opposite surface in a thickness suitable for parts attachment in a soldering process. Finally, the leadframe structure is stamped from the sheet so that the stamped edges extend between the two surfaces and expose the (copper) base metal, promoting excellent adhesion to molding compounds.

In the second embodiment of the invention, a continuous strip of sheet-like metal such as copper is used, and nickel layers are flood-plated on both surfaces of the sheet. Next, a thin layer of palladium is plated on one surface in a thickness suitable for bonding wire attachment. A layer of lead-free solder, such as tin/copper, is then plated on the opposite surface in a thickness and with a reflow temperature suitable for parts attachment in a soldering process in which the layer is dissolved in the soldering media. Finally, the leadframe structure is stamped from the sheet so that the stamped edges extend between the two surfaces and expose the (copper) base metal, promoting excellent adhesion to molding compounds.

Leadframes prepared according to the invention can be successfully used in surface mount technologies of small outline no-lead of leadless packages.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to the assembly of semiconductor integrated circuits (ICs) on leadframes, including wire bonding interconnection, and their final encapsulation, the sequential construction of these leadframes using deposited layers of various metals, and the environmentally friendly process of reliable attachment of the devices to substrates using lead-free solder.

The invention reduces the cost of leadframes while the leadframe functions are maximized. The invention generally applies to any leadframe and any substrate used in semiconductor technology which exhibit the following design features: Usually, a chip mount pad for support of the IC chip surrounded by lead segments, each having a first end in proximity of the chip pad, and a second end remote from the chip pad. The invention best applies to small outline no-lead devices, in which the chip mount pad is exposed to the outside (and thus maximizes heat dissipation) and the leads are directly attached to the substrate or other parts (without needing the conventional forming step).

Figure 1A:
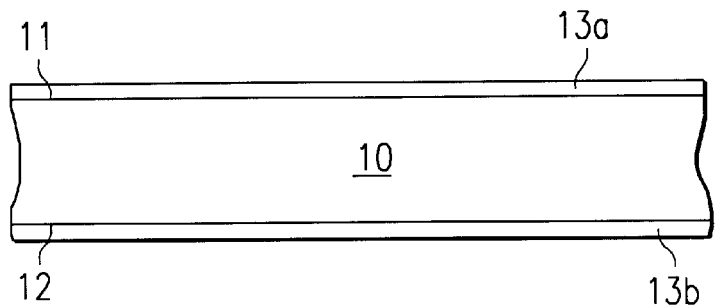
FIG. 1A is a schematic cross section of a portion of a continuous strip of sheet-like base metal with plated nickel layers on both surfaces.

As shown in the schematic cross section of FIG. 1A, the structure and process of the present invention starts with a continuous strip of sheet-like base metal 10, having first surface 11 and second opposite surface 12. The base metal is selected from a group consisting of copper, copper alloy, brass, aluminum, iron-nickel alloy ("Alloy 42") and invar.

As defined herein, the starting material of the leadframe is called the "base metal", indicating the type of metal.

Consequently, the term "base metal" is not to be construed in an electrochemical sense (as in opposition to 'noble metal') or in a structural sense. The base metal of leadframes is typically copper or copper alloys. Typical thicknesses of the base metal are between about 100 and 250 µm; thinner sheets are possible. The ductility in this thickness range provides the 5 to 15% elongation needed in the segment bending and forming operation after the leadframe has been stamped.

According to the invention, a plurality of metal layers are deposited onto the base metal while still in strip form, in a plurality of thicknesses. The materials and thicknesses of these layers are selected so that after stamping, the segments of the leadframe satisfy five needs in semiconductor assembly:

1) Leadframes have to comprise segment ends near the chip mount pad ("inner segments") for bond attachments to wire interconnections;
2) Leadframes have to comprise segment ends remote from the chip mount pad ("outer segments") for solder attachment to other parts;
3) leadframes have to comprise segments ductile for forming and bending the segments;
4) leadframe surfaces have to comprise adhesion to molding compounds; and
5) leadframe segments have to comprise insensitivity to corrosion.

Figure 1B:
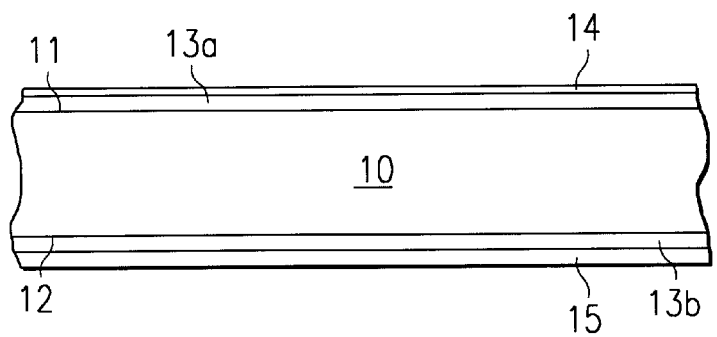
FIG. 1B is the schematic cross section of FIG. 1A including plated layers according to the first embodiment of the invention.

In the first embodiment of the invention, depicted in FIGS. 1A and 1B, a layer of nickel is deposited onto both the first surface 11 of the base metal 10 (layer designated 13a in FIG. 1A) and the second opposite surface 12 (layer designated 13b in FIG. 1A). The nickel is flood plated so that both layers 13a and 13b have the same thickness in the range from about 0.5 to 3.0 µm.

Next, the nickel 13b covering the second surface 12 is protected by a simple mask covering the total surface of the sheet; then, a layer 14 of bondable metal is plated onto nickel layer 13a on the first surface 11 (see FIG. 1B). Palladium is the preferred choice for the bondable metal because of its added benefit of promoting good adhesion to molding compounds. Palladium layer 14 is thin and has only a thickness in the range from about 20 to 60 nm, but it ensures reliable bonding wire attachment (stitch bond, wedge bonds, and ball bonds). Need 1) of the above requirements is thus fulfilled.

Finally, the palladium layer 14 is protected by a simple mask covering the total surface of the sheet. A layer 15 of solderable metal is plated onto nickel layer 13b on the second surface 12 (see FIG. 1B). For this embodiment of the invention, the preferred choice for the solderable metal is a modestly thick palladium layer in the range from about 60 to 180 nm. Strictly speaking, the palladium will be dissolved into the solder paste during the soldering process, enabling good wetting of the solder to the underlying nickel and thus reliable attachment to other parts. Need 2) of the above requirements is thus fulfilled. After stamping of the leadframe structure from the continuous strip, the palladium from the scrap metal will be recovered so that the overall consumption of palladium is small.

The plating sequence of the two palladium layers can be reversed. Further, it may be possible to achieve the deposition results without masks by manipulating the plating anodes and flow.

The invention satisfies Need 3) by the selection of thickness and structure of the nickel layer employed to fulfill need 1). Thickness and deposition method of the nickel layer have to be selected such that the layer insures ductility and enables the bending and forming of the lead segments.

The invention satisfies Need 4) by the choice of the noble metal layer employed to fulfill need 1); a practical selection is palladium with its excellent adhesion to thermoset molding compounds and other encapsulation materials.

The invention satisfies Need 5) by the sequence of layers deposited over the copper base: Nickel and palladium.

Figure 2A:
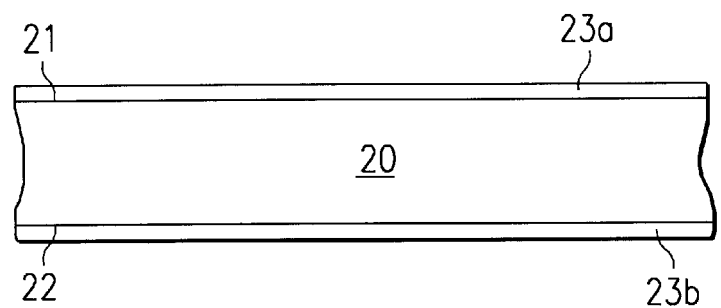
FIG. 2A is a schematic cross section of a portion of a continuous strip of sheet-like base metal with plated nickel layers on both surfaces.
Figure 2B:
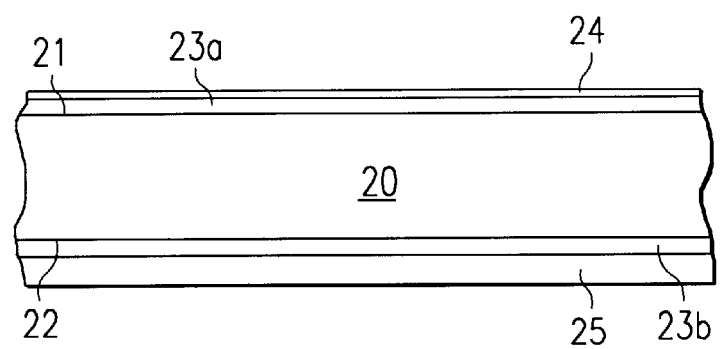
FIG. 2B is the schematic cross section of FIG. 2A including plated layers according to the second embodiment of the invention.

In the second embodiment of the invention, depicted in FIGS. 2A and 2B, a continuous strip of sheet-like base metal 20, having first surface 21 and second opposite surface 22, is selected from a group consisting of copper, copper alloy, brass, aluminum, iron-nickel alloy, and invar. A layer of nickel is deposited onto both the first surface 21 of the base metal 20 (layer designated 23a in FIG. 2A) and the second opposite surface 22 (layer designated 23b in FIG. 2A). Layer thickness is in the range from about 0.5 to 3.0 µ.

Next, the nickel 23b covering the second surface 22 is protected by a simple mask; then, a layer 24 of bondable metal is plated onto nickel layer 23a on the first surface 21 (see FIG. 2B). Palladium in the range from about 20 to 60 nm thick is the preferred choice. It ensures reliable bonding wire attachment and good adhesion to molding compounds.

Finally, the palladium layer 24 is protected by a simple mask. A layer 25 of lead-free solder is plated onto nickel layer 23b on the second surface 22 (see FIG. 2B). The solder material is selected from a group consisting of tin, tin alloys including tin/copper, tin/indium, tin/silver, tin/bismuth, and conductive adhesive compounds. A preferred choice is a tin/copper alloy having 2% to 15% copper and a reflow temperature compatible with wire bonding temperatures and molding temperatures. The solder layer has a thickness in the range from about 3 to 25 µm.

For the plating steps in FIGS. 1A, 1B, 2A, and 2B, a wheel system is preferred, as described, for example, in U.S. patent application No. 60/138,070 cited above.

In the plating process, the continuous strip of sheet-like material, for instance copper, is first immersed in an alkaline preclean solution at 20 to 90° C. for few seconds up to 3 minutes. Both alkaline soak cleaning and alkaline electro-cleaning are employed. Oils, grease, soil, dirt and other contamination are thereby removed.

After rinsing, the strip is next immersed in an acid activation bath at room temperature for few seconds up to 5 minutes. The bath consists of a solution of sulfuric acid, hydrochloric acid, or other acid solution, preferably at about 30 to 60 g/l concentration. This solution removes copper oxide and leaves the metallic copper oxide surface in an activated state, ready to accept the deposition of metallic nickel.

Next, the strip is immersed in a first nickel plating solution to receive the deposition onto the copper base material of a nickel strike in the thickness range of about 0.02 to 0.13 µm. This first nickel layer fully encases the copper base metal and thus keeps the subsequent main nickel bath free from copper and copper compounds.

Next, the leadframe is immersed in a second nickel plating solution to receive the deposition onto the first nickel layer of an additional nickel layer in the thickness range of about 0.45 to 2.0 µm. The total thickness range of layer 104 is approximately 0.5 to 2.5 µm. This nickel layer has to be ductile for the leadframe segment bending and forming process. Further, the nickel surface has to be wettable in the soldering process, so that solder alloys or conductive adhesives can be used successfully.

The palladium layers described in FIG. 1B and the palladium and solder layer described in FIG. 2B are plated by similar methods.

Figure 3A:
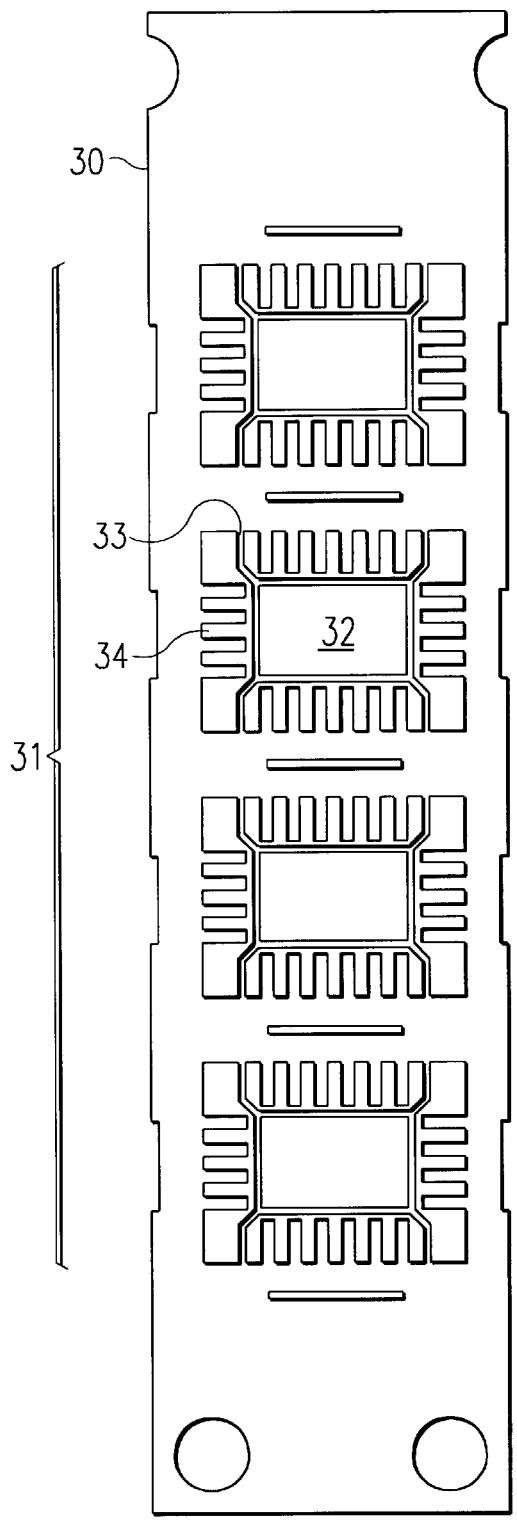
FIG. 3A is a simplified top view of an example of a strip portion providing a plurality of leadframes for a small outline no-lead device, the leadframes stamped from a sheet as illustrated in FIGS. 1B and 2B.

It is important for the present invention that the leadframe structures are fabricated from the plated strips by a stamping process after the plating steps have been completed, so that portions of the leadframe edges exhibit the base material of the starting strip. This base metal contributes significantly to good adhesion to molding compounds of the finished package. As a typical example, FIG. 3A shows a portion 30 of a sheet-like strip (the strip is about 30.7 mm long and 7.6 mm wide). In this strip is a plurality 31 of structures stamped, designed for a small outline leadframe (so-called SON device). Each structure consists of a chip pad 32, pad straps 33, and 20 leads 34.

Depending on the stamping technology, it may be required to clean or degrease the stamped parts.

Figure 3B:
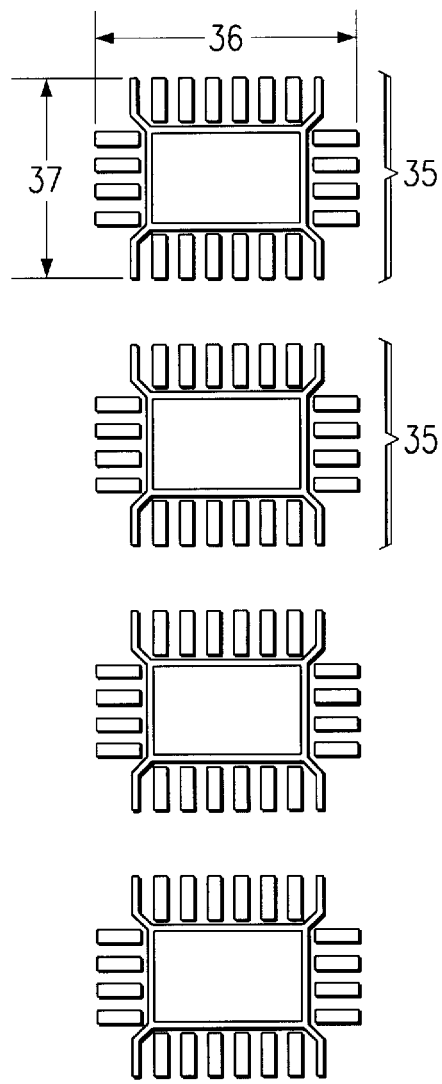
FIG. 3B is a simplified top vies of those metal portions of the leadframes in FIG. 3A which will remain inside the small outline no-lead package after the process steps of encapsulation and trimming (and sometimes forming).

FIG. 3B shows the metallic leadframe portions 35 remaining inside the SON devices after they have completed the encapsulation process, and the sheet-like strip has completed the trimming process. In the example of FIG. 3B, a leadframe unit 35 has a lateral dimension 36 of 5.0 mm and lateral dimension 37 of 4.0 mm.

Figure 4A:
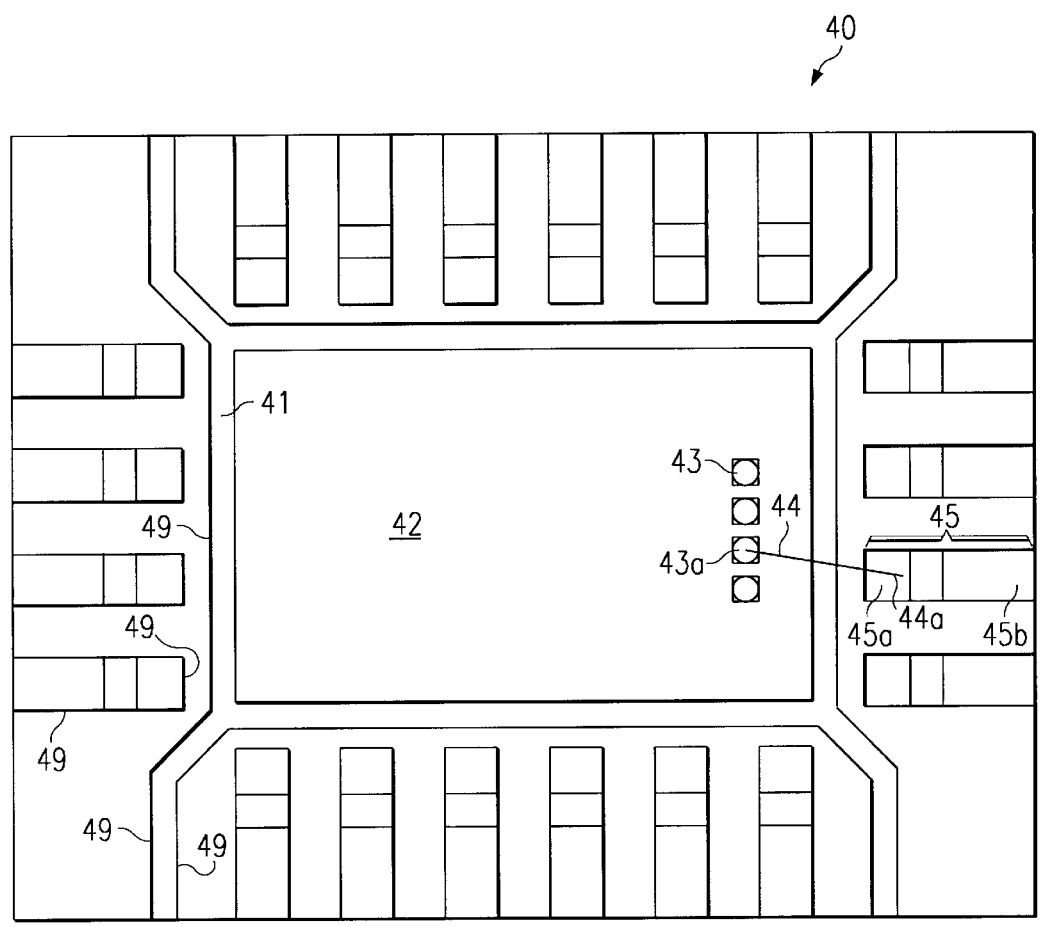
FIG. 4A is a simplified top "X-ray" view of an example of a molded small outline no-lead device, having a leadframe as shown in FIG. 3B, fabricated according to the invention.

One of the stamped leadframe units 35 of FIG. 3B is depicted magnified in FIG. 4A, which represents a top "X-ray" view of the molded unit 40. Attached to the chip mount pad 41 is IC chip 42. In the device example of FIG. 4A, chip 42 has lateral dimensions of approximately 1.7×2.7 mm, and chip pad 41 of approximately 2.0×3.0 mm. Only a few of the wire bond pads 43 of chip 42 are shown. One of the bond pads 43a has a bonding wire 44 attached, which connects the chip to a lead 45 of the leadframe. In FIG. 4A, the lateral dimensions of lead 45 are about 0.85×0.3 mm; the lead pitch is 0.5 mm.

Figure 4B:
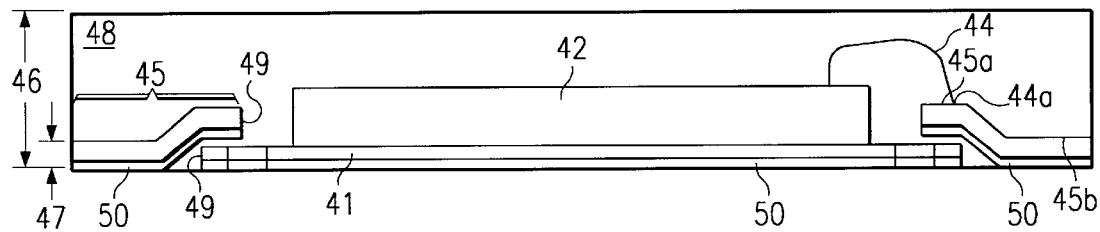
FIG. 4B is a simplified side "X-ray" view of the molded device illustrated in FIG. 4A, depicting a molded small outline no-lead device having a leadframe fabricated according to the invention.

The "X-ray" side view of FIG. 4B illustrates the location of the leadframe example of FIG. 4A inside the molded unit. The total thickness 46 of the device is about 0.8 mm, of which the leadframe sheet contributes a thickness 47 of about 0.1 mm and the encapsulation material the remainder of 0.7 mm. It is essential for the present invention that the base metal of the leadframe sheet is exposed to the molding material 48 on all edges 49 (see examples in FIGS. 4B and 4A) which have been created by the stamping process of the leadframe structure. Copper or copper alloy, the typical metal of the leadframe strip, has been demonstrated to give superior mold compound adhesion to most mold compound used in the fabrication of IC devices.

Optionally, yet not shown in FIGS. 4A and 4B, a surface treatment of the copper can be applied, such as Ebonal™, that will further enhance mold compound adhesion.

As can be seen in FIG. 4B, the plated layer 50 of solderable material is available on all leadframe portions facing the "outside world" for solder attachment to other parts. As stated above, when a solder alloy is chosen as plated material, the layer thickness is in the range from about 3 to 25 $\mu$m; when palladium is chosen, the layer thickness is in the range from 60 to 180 nm.

When a solder alloy is chosen for the pre-plated layer, it is important to the present invention that the solder is lead-free;

the solder has a reflow temperature higher than IC assembly temperatures, including wire bonding and package molding;

the solder is able to dissolve into the solder flux or wave during device board attach and the solder avoids tin whisker growth.

The electronic industry has been searching for a substitute for the customary lead in the solder for several years. Recent reviews on the status of this search are, for instance, given by the National Center for Manufacturing Sciences, "NCMS Lead-free Solder Project", Surface Mount Technology, vol. 14, no. 2, pp. 73–80, 2000; and by J. S. Hwang, Z. Guo, and H. Koenigsmann, "High-strength and High-fatigue-resistant Lead-free Solder", Surface Mount Techn., vol. 14, no. 3, pp. 55–60, 2000.

Various binary and tertiary alloys have been discussed. For example, U.S. Pat. No. 5,985,212, issued on 16, Nov. 1999 (Hwang et al., "High Strength Lead-free Solder Materials"), recommends at least 75 weight % tin, between about 0.01 and 9.5 weight % Cu, between about 0.01 and 5.0 weight % gallium, and between about >0 and 6% indium.

For the intent of the present invention, the solder layer may comprise materials selected from a group consisting of tin, tin alloys such as tin/copper, tin/indium, tin/silver, and tin/bismuth, tertiary alloys (also containing gallium), and conductive adhesive compounds. A preferred easy-to-plate solder alloy is a binary tin and copper alloy; a tin and silver alloy is another preferred solder. The composition is to be optimized to bring the reflow temperature above the temperatures seen at the various assembly steps (chip attach, wire bonding, molding, curing) which vary from device to device. For example, if 270° C. is the target, 2.5 weight % copper is appropriate in the tin/copper alloy; if 300° C. is the target, 5.0 weight % copper is appropriate. The tin/copper, or tin/silver alloy does not need to melt, but will rather dissolve into the solder paste or wave, offering good wettablilty of the underlying nickel.

As defined herein, each lead segment 45 has a first end 45a near the chip mount pad 41 and a second end 45b remote from chip mount pad 41. It is required that the first ends 45a have a palladium layer in a thickness suitable for bonding wire attachment. As stated above, a suitable thickness range is from about 20 to 60 nm. Based on the fabrication method of this invention, this thin palladium layer (not shown in FIG. 4B) covers the complete leadframe surface opposite to the solder layer (see FIG. 2B). Another choice as noble metal would be rhodium. The palladium thickness could possibly be reduced to about 10 and 30 nm.

In this thickness range, palladium is suitable for all wire bonding attachments (stitch bonds, ball bonds, and wedge bonds) and retains its excellent adhesion to thermoplastic molding compounds—an attribute crucial for avoiding package delamination and progressive corrosion.

In FIGS. 4A and 4B, bonding wires 44 have stitches 44a welded to the palladium surface of the first ends 45a of leadframe segments 45. The bonding wires are selected from a group consisting of gold, copper, aluminum, and alloys thereof. Any of these metals provide reliable welds to the layered leadframes of the invention.

As shown in FIG. 4B, segments 45 are suitable for bending and forming due to the ductility of the copper base and the plated nickel layer. In general, copper leads plated with the tin/copper alloy of the invention have better trim/form performance than leads plated with the traditional lead/tin alloy due to improved ductility. Using this malleable characteristic, segments 45 may be formed in any shape required for surface mounting or any other technique of board attach of the semiconductor devices. The bending of the segments does not diminish the corrosion protection of the segments 45.

The tin/copper or palladium plated leadframe of the invention provides for easy and reliable solder attachment to boards or other parts of the formed leadframe segments. When solder pastes or solder waves are used, the paste or wave may dissolve the plated tin/copper or palladium layer, resulting in good wetting characteristics to the plated nickel surface of the copper leadframe.

In FIGS. 4A and 4B, molding compound 48 encapsulates the mounted chip 42, bonding wires 44 and the first ends 45a of the lead segments 45. The second, remote ends 45b of the segments are adhering to the molding compound only with their first surfaces plated with the thin palladium layer needed for reliable wire bonding. The second surface covered by layer 50 of the solderable material is facing the outside of the package to remain exposed for solder attachment. Typically, the encapsulation material 48 is selected from a group consisting of epoxy-based molding compounds suitable for adhesion to the leadframe surfaces. For palladium, excellent adhesion characteristics to molding compounds can be achieved, preventing package delamination, moisture ingress and corrosion.

In regard to corrosion, it should be pointed out that copper creep corrosion is a function of the nobility of the exposed surface. In the present invention, the surface of the leadframe has nickel, nickel oxide, and tin/copper on it. This will present copper creep corrosion as compared to a surface with pure palladium, and the performance in the mixed flowing gas corrosion tests is accordingly better.

As stated above, it is an essential feature of the present invention that all leadframe edges 49 exposed the base metal of the leadframe, preferably copper. Copper offers superior adhesion to the molding compounds quoted above.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the designs, cover areas and fabrication methods of the solder layer and of the palladium layer may be modified to suit specific leadframe or substrate needs. It is therefore intended that the appended claims encompass any such modifications or embodiments.

We claim:

1. A continuous strip of sheet-like material, having first and second opposite surfaces, for use in fabricating integrated circuit leadframes, comprising:

a base metal having an adherent layer comprising nickel covering both said surfaces of said base metal;

an adherent layer of palladium on only said nickel layer of said first surface; and an adherent layer of lead-free solder on only said nickel layer of said second surface, said solder comprising a tin/copper alloy containing about 2% to 15% copper.

2. The strip according to claim 1 wherein said base metal is copper, copper alloy, brass, aluminum, iron-nickel alloy, or invar.

3. The strip according to claim 1 wherein said base metal has a thickness between about 100 and 250 $\mu$m.

4. The strip according to claim 1 wherein said nickel layer has a thickness in the range from about 0.5 to 3.0 $\mu$m.

5. A leadframe for use in the assembly of integrated circuit chips, said leadframe having a base metal sheet of substantially parallel first and second surfaces, an adherent nickel layer covering both surfaces, a palladium layer adherent to said nickel on said first surface and a lead-free solder layer adherent to said nickel on said second surface, comprising:

a structure stamped from said sheet so that the stamped edges extend between said first and second surfaces; and said edges expose said base metal.

6. The leadframe according to claim 5 wherein said exposed base metal is treated with a material enhancing adhesion to molding compounds.

7. An integrated circuit (IC) device comprising:

a leadframe comprising a base metal sheet of substantially parallel first and second surfaces and a stamped structure of an IC chip mount pad and a plurality of lead segments, each having a first end near said mount pad and a second end remote from said mount pad;

said leadframe having a surface layer of nickel on said first and second surfaces;

said leadframe further having a first palladium layer on said nickel layer on said first surface in a thickness suitable for bonding wire attachment;

said leadframe further having a lead-free solder layer on said nickel layer on said second surface in a thickness suitable for parts attachment;

said leadframe further having said base metal exposed at the edges of said stamped structure, extending between said first and second surfaces;

an IC chip mounted to said mount pad, attached to the surface having the first palladium layer;

bonding wires interconnecting said chip and said first ends of said lead segments; and encapsulation material surrounding said chip, bonding wires and said first ends of said lead segments, while leaving said second ends of said lead segments exposed, whereby optimum adhesion to molding compounds is enabled.

8. The device according to claim 7 wherein said device has a package of the small outline no-lead or leadless type.

* * * * *